United States Patent
Suzuki

(10) Patent No.: US 7,605,078 B2
(45) Date of Patent: Oct. 20, 2009

(54) INTEGRATION OF A VARIABLE THICKNESS COPPER SEED LAYER IN COPPER METALLIZATION

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 11/537,058

(22) Filed: Sep. 29, 2006

(65) Prior Publication Data

US 2008/0081474 A1   Apr. 3, 2008

(51) Int. Cl.
*H01L 21/44* (2006.01)

(52) U.S. Cl. .............. 438/654; 438/686; 257/E21.479; 257/E21.478

(58) Field of Classification Search ............... 438/686, 438/654; 257/E21.479, E21.478
See application file for complete search history.

(56) References Cited

U.S. PATENT DOCUMENTS

| 5,532,190 | A |   | 7/1996  | Goodyear et al. |
|---|---|---|---|---|
| 5,968,333 | A | * | 10/1999 | Nogami et al. ............ 205/184 |
| 6,303,809 | B1 |  | 10/2001 | Chi et al. |
| 6,319,832 | B1 |  | 11/2001 | Uhlenbrock et al. |
| 6,428,850 | B1 |  | 8/2002  | Shinriki et al. |
| 6,440,495 | B1 |  | 8/2002  | Wade et al. |
| 6,478,872 | B1 |  | 11/2002 | Chae et al. |
| 6,605,735 | B2 |  | 8/2003  | Kawano et al. |
| 6,713,373 | B1 |  | 3/2004  | Omstead |
| 2001/0005056 | A1 | * | 6/2001 | Cohen .................... 257/751 |
| 2002/0195352 | A1 | * | 12/2002 | Mayer et al. ............ 205/687 |
| 2003/0116432 | A1 | * | 6/2003 | Schweitzer et al. .... 204/298.11 |
| 2003/0129306 | A1 |  | 7/2003 | Wade et al. |
| 2003/0129774 | A1 | * | 7/2003 | Christian et al. ........... 438/10 |
| 2003/0176011 | A1 | * | 9/2003 | Niira et al. ................. 438/96 |
| 2004/0013577 | A1 |  | 1/2004 | Ganguli et al. |
| 2004/0050325 | A1 |  | 3/2004 | Samoilov et al. |
| 2004/0105934 | A1 |  | 6/2004 | Chang et al. |
| 2004/0241321 | A1 |  | 12/2004 | Ganguli et al. |
| 2005/0019960 | A1 | * | 1/2005 | Lee et al. .................. 438/3 |
| 2005/0081882 | A1 |  | 4/2005 | Greer et al. |
| 2005/0110142 | A1 | * | 5/2005 | Lane et al. ............... 257/751 |
| 2005/0186341 | A1 |  | 8/2005 | Hendrix et al. |
| 2006/0145142 | A1 | * | 7/2006 | Norman ................... 257/40 |
| 2006/0183321 | A1 | * | 8/2006 | Basol ...................... 438/653 |
| 2007/0004201 | A1 | * | 1/2007 | Lubomirsky et al. ..... 438/678 |

(Continued)

FOREIGN PATENT DOCUMENTS

WO    0208487 A1    1/2002

*Primary Examiner*—Caridad M Everhart
(74) *Attorney, Agent, or Firm*—Wood, Herron & Evans, LLP

(57) ABSTRACT

A method for forming a variable thickness Cu seed layer on a substrate for a subsequent Cu electrochemical plating process, where the Cu seed layer thickness profile improves uniformity of the electroplated Cu layer compared to when using a constant thickness Cu seed layer. The method includes depositing a Ru metal layer on the substrate, depositing a variable thickness Cu seed layer on the Ru metal layer by a physical vapor deposition process, whereby the variable thickness Cu seed layer is deposited with a Cu thickness at the edge of the substrate that is less than a Cu thickness at the center of the substrate, and plating bulk Cu onto the variable thickness Cu seed layer. The Ru metal layer may be a variable thickness Ru metal layer, or alternately, the Ru metal layer may have a substantially uniform Ru metal thickness across the substrate.

21 Claims, 5 Drawing Sheets

U.S. PATENT DOCUMENTS

2007/0059502 A1* 3/2007 Wang et al. .................. 428/209
2007/0093006 A1* 4/2007 Basol ......................... 438/150
2007/0099422 A1* 5/2007 Wijekoon et al. ............ 438/687
2007/0264427 A1* 11/2007 Shinriki et al. ............ 427/255.7

* cited by examiner

INTEGRATION OF A VARIABLE THICKNESS COPPER SEED LAYER IN COPPER METALLIZATION

CROSS-REFERENCE TO RELATED APPLICATION

The present invention is related to U.S. patent application Ser. No. 11/092,266, now U.S. Pat. No. 7,351,285 issued Apr. 1, 2008, and entitled METHOD AND SYSTEM FOR FORMING A VARIABLE THICKNESS SEED LAYER, the entire content of which is herein incorporated by reference.

FIELD OF THE INVENTION

The invention relates to semiconductor processing, and more particularly, to a method for forming a variable thickness copper (Cu) seed layer on a ruthenium (Ru) metal layer on a substrate, where the thickness profile of the Cu seed layer improves thickness uniformity of bulk Cu plated onto the Cu seed layer.

BACKGROUND OF THE INVENTION

The introduction of Cu metal into multilayer metallization schemes for manufacturing integrated circuits is enabled by the Damascene Cu plating process and is now extensively used by manufacturers of advanced microprocessors and application-specific chips. As the minimum feature dimensions on patterned substrates (wafers) steadily decreases, several consequences of this downward scaling are becoming apparent. One concern is the extendibility of physical vapor deposition (PVD) to produce Cu seed (nucleation) layers for electrochemical plating of the substrate and the features formed on the substrate. These seed layers must become increasingly thinner due to the decreasing minimum feature sizes, and unless significant improvements in the PVD-Cu step coverage are made, it may not be possible to achieve robust continuous film of Cu onto these features (e.g., on the lower sidewall of a via hole) to permit consistent Cu nucleation during Cu electrodeposition.

Alternatives to PVD-Cu seed layers for Cu electroplating include non-Cu seed layers that can be highly conformally deposited by chemical vapor deposition (CVD) or atomic-layer deposition (ALD). One challenge that Cu and non-Cu seeds pose to electrochemical plating processing and the plating equipment is non-uniform thickness of the plated Cu metal onto the seed layer due to the terminal ('resistive substrate') effect. The terminal effect is the tendency for the current density to be non-uniform as a result of the ohmic potential drop associated with conducting current from the wafer edge to the entire wafer surface through a thin resistive seed layer. Therefore, new methods are required to improve the thickness uniformity of a Cu metal layer electrochemically plated onto a seed layer.

SUMMARY OF THE INVENTION

A method is provided for forming a variable thickness Cu seed layer on a substrate, where the seed layer thickness at the edge of the substrate is less than the thickness at the center of the substrate. The variable thickness Cu seed layer improves thickness uniformity of electrochemically plated bulk Cu deposited onto the variable thickness Cu seed layer compared to when using a constant thickness Cu seed layer.

According to an embodiment of the invention, the method includes depositing a Ru metal layer on the substrate, depositing a variable thickness Cu seed layer on the Ru metal layer by a physical vapor deposition process, whereby the variable thickness Cu seed layer is deposited with a Cu thickness at the edge of the substrate that is less than a Cu thickness at the center of the substrate. The method further includes plating bulk Cu onto the variable thickness Cu seed layer. According to one embodiment, the Ru metal layer may be a variable thickness Ru metal layer with a Ru thickness at the edge of the substrate that is less than a Ru thickness at the center of the substrate. According to another embodiment, the Ru metal layer may have a substantially uniform Ru metal thickness across the substrate.

According to an embodiment of the invention, the substrate may be a patterned substrate containing one or more vias or trenches, or combinations thereof.

DETAILED DESCRIPTION OF SEVERAL EMBODIMENTS OF THE INVENTION

Embodiments of the invention provide a method for forming a variable thickness Cu seed layer on the field of a substrate, where the variable thickness refers to an increase in the Cu seed layer thickness from the edge of the substrate toward the center of the substrate. The Cu seed layer thickness profile improves thickness uniformity of bulk Cu metal electrochemically plated onto the Cu seed layer. The Cu seed layer is deposited onto a Ru metal layer, where the Ru metal layer can have a variable thickness analogous to the variable thickness Cu seed layer, or alternatively, the Ru metal layer can have a substantially uniform thickness across the substrate.

Figure 1A:
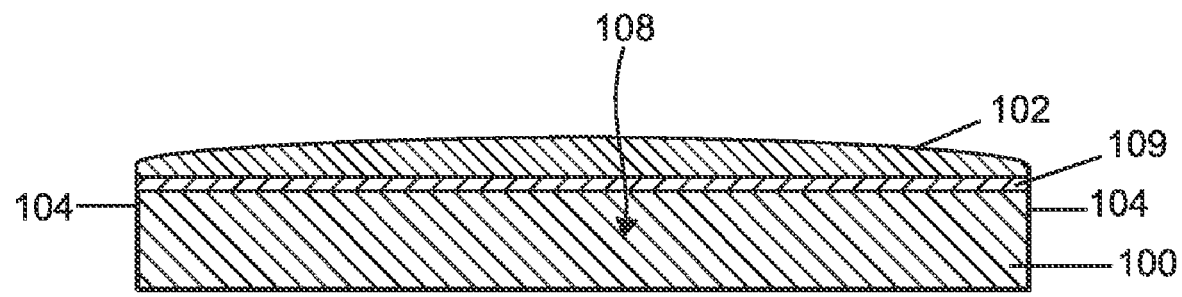
FIG. 1A schematically shows a cross-sectional view of a substrate containing a variable thickness Cu seed layer according to an embodiment of the invention.

Referring now to the drawings, FIG. 1A schematically shows a cross-sectional view of a substrate 100 having a conformal Ru metal layer 109 deposited onto the substrate 100 and a variable thickness Cu seed layer 102 deposited onto the conformal Ru metal layer 109 according to an embodiment of the invention. As depicted in FIG. 1A, the Ru metal layer 109 has a substantially uniform thickness across the substrate 100. A thickness of the Ru metal layer 109 can, for example, be between about 0.5 nm and about 15 nm. The substrate 100 can, for example, be a Si substrate. A Si substrate can be of n- or p-type, depending on the type of device being formed. The substrate 100 can be of any size, for example a 200 mm substrate, a 300 mm substrate, or an even larger substrate.

According to embodiments of the invention, a thickness of the Cu seed layer 102 increases from the edge 104 of the substrate 100 toward the center 108 of the substrate 100. According to one embodiment of the invention, a thickness of the Cu seed layer 102 can be between about 1 nm (nm=10⁻⁹m) to about 10 nm at or near the edge 104 of the substrate 100 and a thickness of the Cu seed layer 102 can be between about 10 nm to about 80 nm at or near the center 108 of the substrate 100. According to another embodiment of the invention, a thickness of the Cu seed layer 102 can be between about 1 nm to about 5 nm at or near the edge 104 of the substrate 100 and a thickness of the Cu seed layer 102 can be between about 5 nm to about 30 nm at or near the center 108 of the substrate 100. However, these thicknesses are exemplary and other thicknesses of the Cu seed layer 102 at or near the edge 104 and the center 108 may be used. For example, a thickness of the Cu seed layer 102 can be greater than 80 nm at or near the center 108. It may be understood that an increase "toward" the center need not be limited to a radial increase from the edge to the very center point, but rather, includes an increase from the edge to some point between the edge and the center.

As described above, during an electroplating process to plate Cu bulk metal on a Cu seed layer, there is a tendency for the current density to be non-uniform as a result of the ohmic potential drop associated with conducting current from the substrate edge to the entire substrate surface. The current density during the plating process can vary as a function of radial location on the substrate, which in turn can result in variations in the plated Cu metal thickness versus radial location on the substrate. In particular, the deposition rate of the plated Cu metal can be higher near the edge of the substrate than at the center of the substrate, especially during early stages of a plating process where little Cu metal has been plated on the substrate.

Embodiments of the invention can reduce or eliminate the above-mentioned problems encountered during a Cu electrochemical plating process where electrical contacts (clips) are placed along the circumference of the substrate to carry the electrical plating current. In order to minimize the terminal effect, which tends to deposit thicker bulk Cu metal near the electrical contacts, the variable thickness Cu seed layer shown in FIG. 1 can reduce the current density non-uniformity during the plating process, thereby resulting in a more uniform Cu metal plating thickness across on the substrate 100.

Figure 1B:
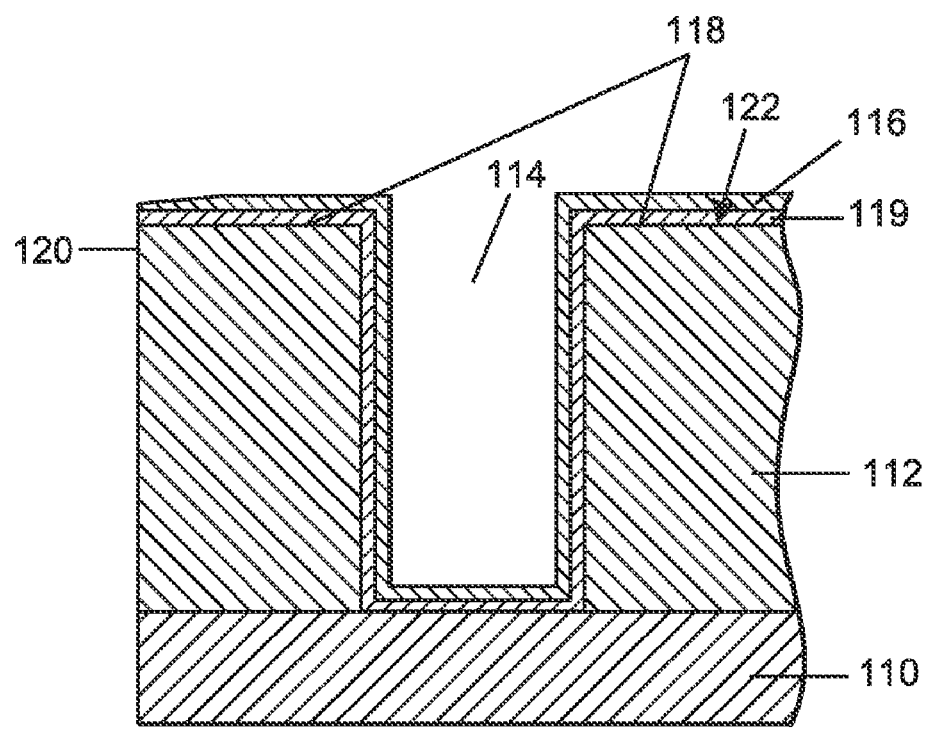
FIG. 1B schematically shows a partial cross-sectional view of a patterned substrate containing a variable thickness Cu seed layer according to another embodiment of the invention.

Embodiments of the invention can be applied to unpatterned and patterned substrates. FIG. 1B schematically shows a cross-sectional view of a variable thickness Cu seed layer 116 deposited onto a Ru metal layer 119 in an opening 114 in a layer 112 formed on a substrate 110 and onto the field 118 away from the opening 114. The thickness of the variable thickness Cu seed layer 116 is less at or near the edge 120 of the layer 112 than at or near the center 122. The thickness of the Cu seed layer 116 on the field 118 can also be different from the thickness of the Cu seed layer in the opening 114. For example, physical vapor deposition of Cu traditionally results in reduced Cu thickness along sidewalls of an opening such as the opening 114. The layer 112 can, for example, be a dielectric material. As will be appreciated by those skilled in the art, the patterned substrate 110 can, in general, contain one or more vias or trenches, or a combination thereof. The vias and trenches can, for example, have openings that are in the sub-micron range, for example less than 65 nm or less than 45 nm. The vias and trenches can have high aspect ratios (depth/width), for example between about 1 and about 10, but embodiments of the invention are not limited to these aspect ratios. As those skilled in the art will appreciate, the structure in FIG. 1B can further contain a diffusion barrier layer (not shown) formed beneath the Ru metal layer 119 on the exposed surfaces of the layer 112 and the substrate 110. The barrier layer can, for example, be a tantalum-containing layer (e.g., Ta, TaN, or TaCN, or a combination thereof), a titanium-containing layer (e.g., Ti, TiN, or a combination thereof), a tungsten-containing layer (e.g., W, WN, or a combination thereof), or combinations thereof.

Figure 2A:
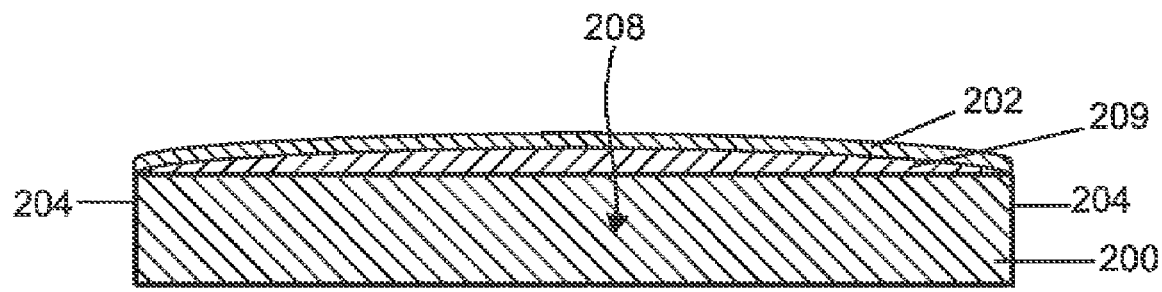
FIG. 2A schematically shows a cross-sectional view of a substrate containing a variable thickness Cu seed layer according to an embodiment of the invention.

FIG. 2A schematically shows a cross-sectional view of a substrate 200 having a variable thickness Ru metal layer 209 deposited onto the substrate 200 and variable thickness Cu seed layer 202 deposited onto the variable thickness Ru metal layer 209 according to an embodiment of the invention. Analogous to the role of the variable thickness Cu seed layer, a role of the variable thickness Ru metal layer 209 is to further reduce the above-described terminal effect during electrochemical plating. As with the variable thickness Cu seed layer 102 in FIG. 1A, the thicknesses of the variable thickness Ru metal layer 209 and the variable thickness Cu seed layer 202, increase from the edge 204 of the substrate 200 toward the center 208 of the substrate 200. According to one embodiment of the invention, the thickness of the Cu seed layer 202 can be between about 1 nm to about 10 nm at or near the edge 204 of the substrate 200 and the thickness of the Cu seed layer 202 can be between about 10 nm to about 80 nm at or near the center 208 of the substrate 200. According to another embodiment of the invention, the thickness of the Cu seed layer 202 can be between about 1 nm to about 5 nm at or near the edge 204 of the substrate 200 and the thickness of the Cu seed layer 202 can be between about 5 nm to about 30 nm at or near the center 208 of the substrate 200. According to one embodiment of the invention, the thickness of the Ru metal layer 209 can be between about 0.5 nm to about 5 nm at or near the edge 204 of the substrate 200 and the thickness of the Ru metal layer 209 can be between about 5 nm to about 15 nm at or near the center 208 of the substrate 200. According to another embodiment of the invention, the thickness of the Ru metal layer 209 can be between about 1 nm to about 4 nm at or near the edge 204 of the substrate 200 and the thickness of the Ru metal layer 209 can be between about 4 nm to about 15 nm at or near the center 208 of the substrate 200.

Figure 2B:
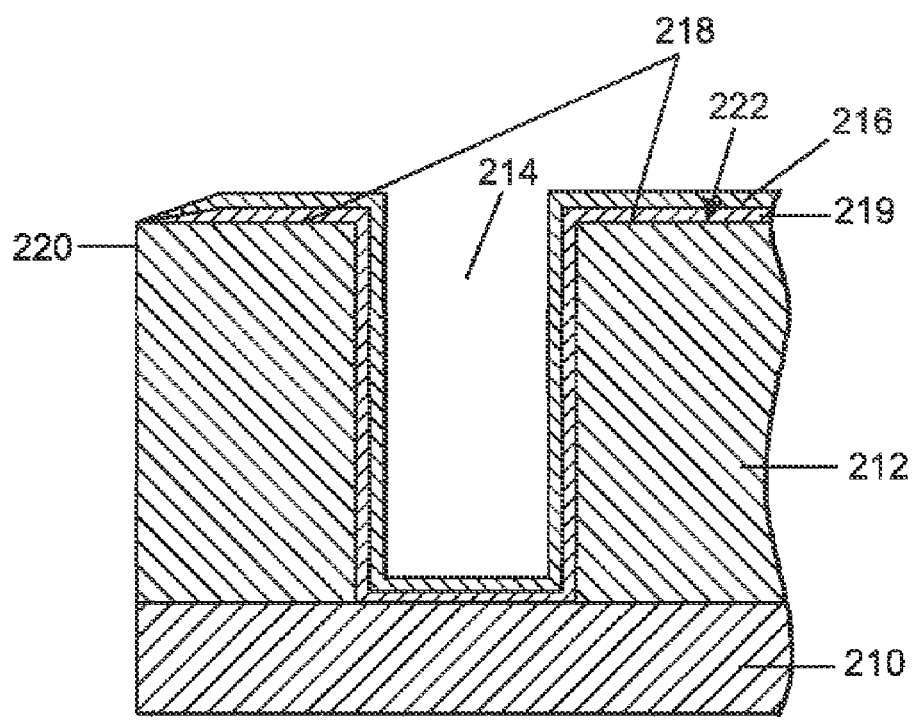
FIG. 2B schematically shows a partial cross-sectional view of a patterned substrate containing a variable thickness Cu seed layer according to another embodiment of the invention.

FIG. 2B schematically shows a cross-sectional view of a variable thickness Cu seed layer 216 deposited onto a variable thickness Ru metal layer 219 in an opening 214 in a layer 212 formed on the substrate 210 and onto the field 218 away from the opening 214. A thickness of the variable thickness Ru metal layer 219 and Cu seed layer 216 is less at or near the edge 220 of the layer 212 than at or near the center 222. Thicknesses of the Ru metal layer 219 and the Cu seed layer 216 on the field 218 can also be different from the thicknesses of the layers 219 and 216 in the opening 214. The layer 212 can, for example, be a dielectric material. The structure in FIG. 2B can further contain a diffusion barrier layer (not shown) formed beneath the Ru metal layer 219 on the exposed surfaces of the layer 212 and the substrate 210. The barrier layer can, for example, be a tantalum-containing layer (e.g., Ta, TaN, or TaCN, or a combination thereof), a titanium-containing layer (e.g., Ti, TiN, or a combination thereof), a tungsten-containing layer (e.g., W, WN, or a combination thereof), or combinations thereof.

In the following description, in order to facilitate a thorough understanding of the invention and for purposes of explanation and not limitation, specific details are set forth, such as a particular geometry of processing systems and descriptions of various components. However, it should be understood that the invention may be practiced in other embodiments that depart from these specific details.

Figure 3:
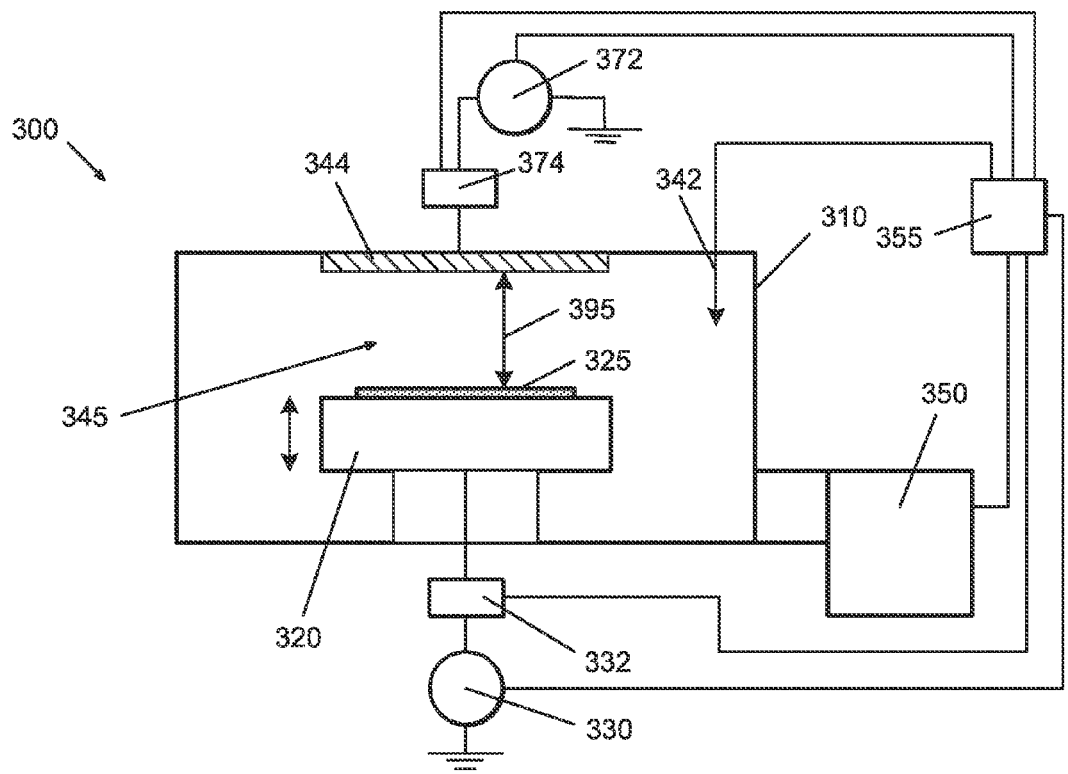
FIGS. 3-6 schematically show physical vapor deposition processing systems configured for depositing a variable thickness Cu seed layer according to embodiments of the invention.

FIGS. 3-6 schematically show PVD processing systems configured for depositing a variable thickness Cu seed layer according to embodiments of the invention. According to one embodiment, a variable thickness Ru metal layer may be deposited from a Ru metal target using any of the PVD processing systems depicted in FIGS. 3-6. FIG. 3 schematically shows a PVD processing system 300 capable of sustaining a plasma and includes a process chamber 310 configured to facilitate the generation of plasma in processing region 345. The PVD processing system 300 further comprises a substrate holder 320 upon which a substrate 325 to be processed is affixed, a gas injection system 342 for introducing a process gas to the process chamber 310, a power generator 330 and impedance match network 332 for delivering RF power to the substrate holder 320, a vacuum pumping system 350, and a controller 355. The impedance match network 332 serves to maximize the transfer of RF power to plasma in processing chamber 310 by minimizing the reflected power. Match network topologies (e.g., L-type, π-type, T-type) and automatic control methods are known in the art. A typical frequency for the power generator 330 ranges from 1 MHz to 100 MHz and can be 13.56 MHz. In an alternate embodiment, RF power can be applied to the substrate holder electrode at multiple frequencies. According to one embodiment, the power generator 330 may be configured for providing RF power, DC bias, or both, to the substrate holder 320.

The gas injection system 342 allows independent control over the delivery of a process gas to the process chamber 310 from ex-situ gas sources. An ionizable gas or mixture of gases is introduced via the gas injection system 342 and the process pressure in the process chamber 310 is adjusted. For example, controller 355 is used to control the vacuum pumping system 350 and gas injection system 342.

Substrate 325 is transferred into and out of process chamber 310 through a slot valve (not shown) and chamber feedthrough (not shown) via a robotic substrate transfer system where it is received by substrate lift pins (not shown) housed within substrate holder 320 and mechanically translated by devices housed therein. Once the substrate 325 is received from the substrate transfer system, it is lowered to an upper surface of the substrate holder 320.

In an alternate embodiment, the substrate 325 is affixed to the substrate holder 320 via an electrostatic clamp (not shown). Furthermore, the substrate holder 320 further includes a cooling system (not shown) including a re-circulating coolant flow that receives heat from the substrate holder 320 and transfers heat to a heat exchanger system (not shown), or when heating, transfers heat from the heat exchanger system. Moreover, gas may be delivered to the backside of the substrate 325 to improve the gas-gap thermal conductance between the substrate 325 and the substrate holder 320. Such a system is utilized when temperature control of the substrate 325 is required at elevated or reduced temperatures. For example, temperature control of the substrate 325 may be useful at temperatures in excess of the steady-state temperature achieved due to a balance of the heat flux delivered to the substrate 325 from the plasma and the heat flux removed from substrate 325 by conduction to the substrate holder 320. In other embodiments, heating elements, such as resistive heating elements, or thermoelectric heaters/coolers are included.

A high purity Cu sputtering target 344 faces the substrate 325 and the substrate holder 320. The vertical position of the substrate holder 320 relative to the Cu sputtering target 344 can be adjusted to change the gap 395 between the bottom of the Cu sputtering target 344 and the substrate 325 residing on the substrate holder 320. The gap 395 can, for example, be adjusted from about 5 mm to about 50 mm. The Cu sputtering target 344 may be powered by a RF generator 372 and impedance match network 374.

A controller 355 includes a microprocessor, a memory, and a digital I/O port capable of generating control voltages sufficient to communicate and activate inputs to the PVD processing system 300 as well as monitor outputs from the PVD processing system 300. Moreover, the controller 355 is coupled to and exchanges information with the power generator 330, the impedance match network 332, the gas injection system 342, the RF generator 372, the impedance match network 374, and the vacuum pumping system 350. A program stored in the memory of the controller 355 is utilized to control the aforementioned components of the PVD processing system 300 according to a stored process recipe.

Figure 4:
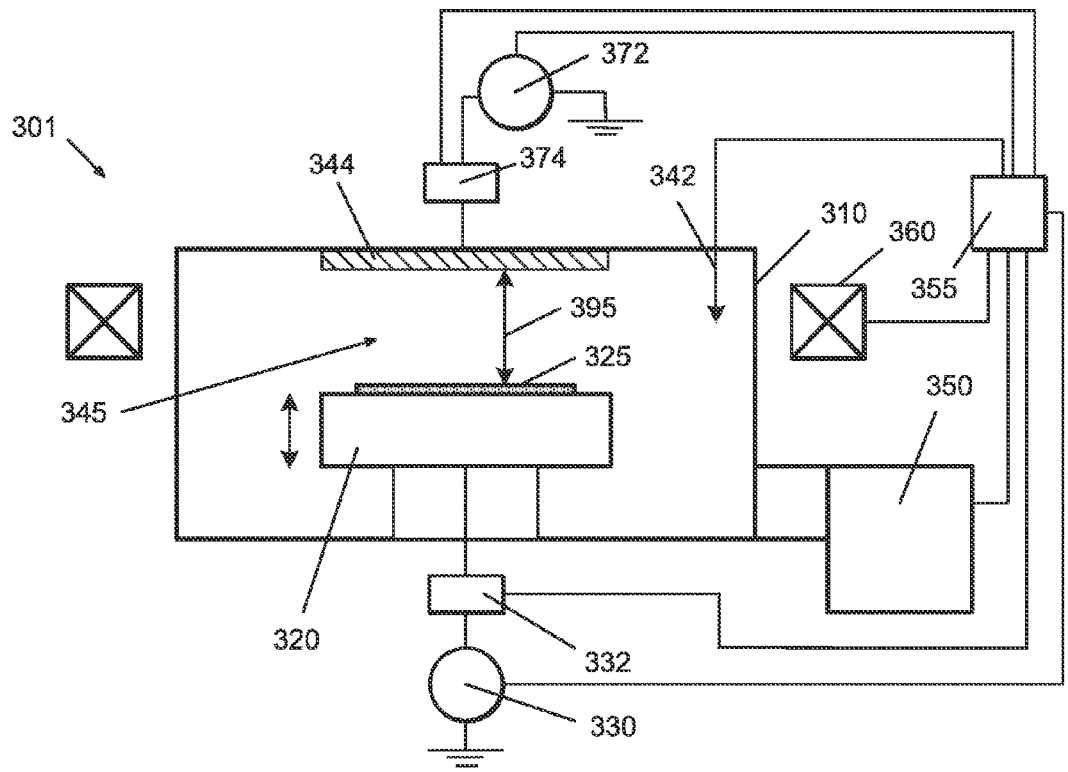

FIG. 4 schematically shows a PVD processing system configured for depositing a variable thickness Cu seed layer according to another embodiment of the invention. The PVD processing system 301 of FIG. 4 is similar to the PVD processing system 300 depicted and described with reference to FIG. 3 but further includes a mechanically or electrically rotating DC magnetic field system 360 to potentially increase plasma density and/or improve plasma processing uniformity. Moreover, the controller 355 is coupled to the rotating magnetic field system 360 in order to regulate the speed of rotation and the field strength.

Figure 5:
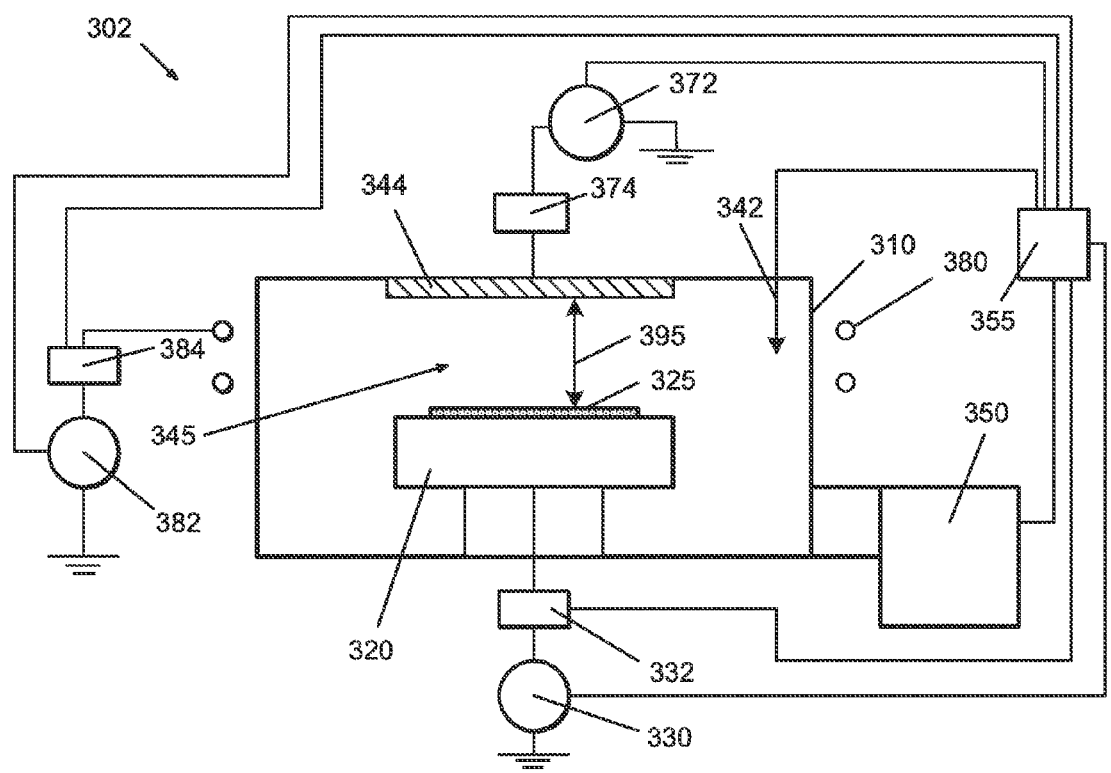

FIG. 5 schematically shows a PVD processing system configured for depositing a variable thickness Cu seed layer according to yet another embodiment of the invention. The PVD processing system 302 of FIG. 5 is similar to the PVD processing system 300 depicted in and described with reference to FIG. 3, but further includes an inductive coil 380 to which RF power is coupled via a RF generator 382 through an impedance match network 384. RF power is inductively coupled from the inductive coil 380 through a dielectric window (not shown) to the processing region 345. A typical frequency for the application of RF power to the inductive coil 380 ranges from 10 MHz to 100 MHz, for example 13.56 MHz. Similarly, a typical frequency for the application of RF power to the substrate holder 320 ranges from 0.1 MHz to 30 MHz, for example 13.56 MHz. In addition, a slotted Faraday shield (not shown) can be employed to reduce capacitive coupling between the inductive coil 380 and plasma. Moreover, the controller 355 is coupled to the RF generator 382 and the impedance match network 384 in order to control the application of RF power to the inductive coil 380.

Figure 6:
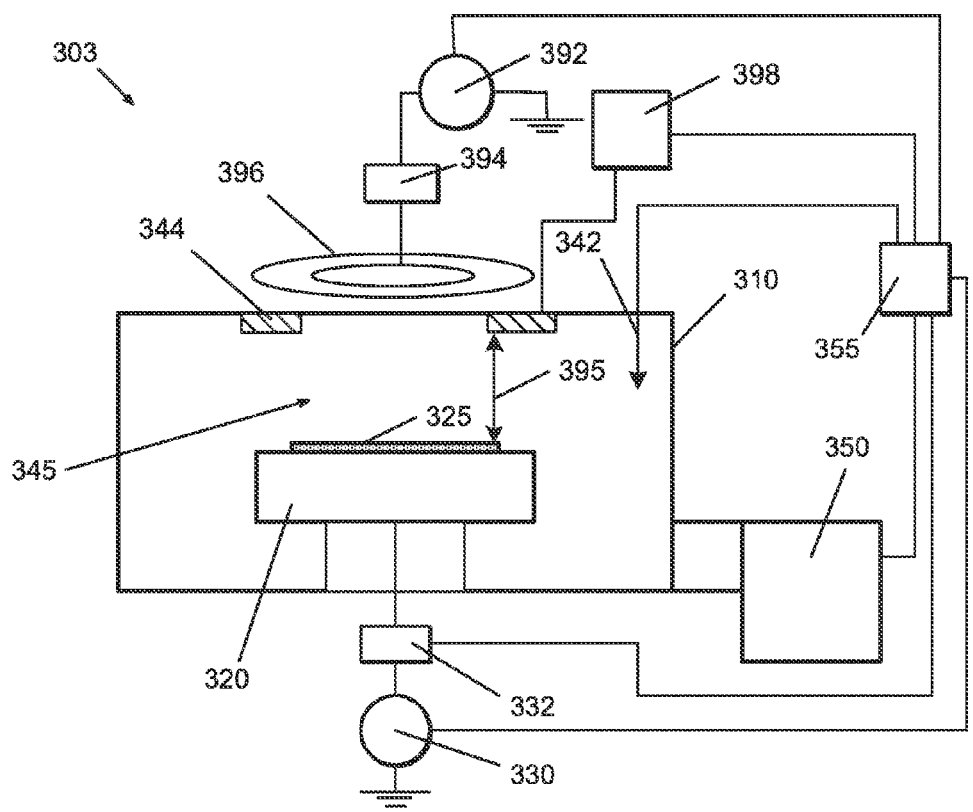

FIG. 6 schematically shows a PVD processing system configured for depositing a variable thickness Cu seed layer according to yet another embodiment of the invention. The PVD processing system 302 of FIG. 6 is similar to the PVD processing system 300 depicted in and described with reference to FIG. 3, but further includes an antenna 396 to couple RF power from a RF generator 392 through an impedance match network 394. RF power is inductively coupled from the antenna 396 through a dielectric window (not shown) to the processing region 345. A typical frequency for the application of RF power to the antenna 396 from 10 MHz to 200 MHz, for example 60 MHz. Additionally, a typical frequency for the application of RF power to the substrate holder 320 ranges from 0.1 MHz to 30 MHz, for example 2 MHz. Moreover, the controller 355 is coupled to the RF generator 392 and the impedance match network 394 in order to control the application of RF power to the antenna 396. An exemplary processing system containing an antenna is described in U.S. Pat. No. 6,287,435, the entire content of which is herein incorporated by reference.

In the exemplary PVD processing system depicted in FIGS. 3-6, process parameters are normally optimized for depositing material layers with high center to edge thickness uniformity on the substrate 325. According to embodiments of the invention, several process parameter may be adjusted from those optimized values to affect the center to edge thickness uniformity of a variable thickness Cu seed layer or a variable thickness Ru metal layer. For example, the gas pressure in the process chamber 310, the gap 395, or both, may be increased. Furthermore, in the PVD processing system 303 depicted in FIG. 6, RF power coupled to the inductive coil 380 and power (RF, DC, or both) coupled to the substrate holder 320 by the power generator 330 and impedance match network 332 may be increased.

However, although many process parameters may be adjusted to affect the thickness uniformity, an increase in layer thickness can affect the amount of Cu overhang over patterned features and openings on a substrate. For example, the formation of Cu or Ru overhangs around the openings 114 and 214 in FIGS. 1B and 2B would reduced the diameter of the openings and thereby affect subsequent plating of Cu into the openings. Therefore, both layer thickness across a substrate and amount of Cu or Ru overhang may be considered when adjusting the process parameters.

Processing systems for depositing a Ru metal layer will now be described. An exemplary processing system capable of depositing a Ru metal layer having a uniform thickness across a substrate is described in U.S. Patent Application Publication No. 2006/0110530 A1, the entire content of which is herein incorporated by reference.

Figure 7:
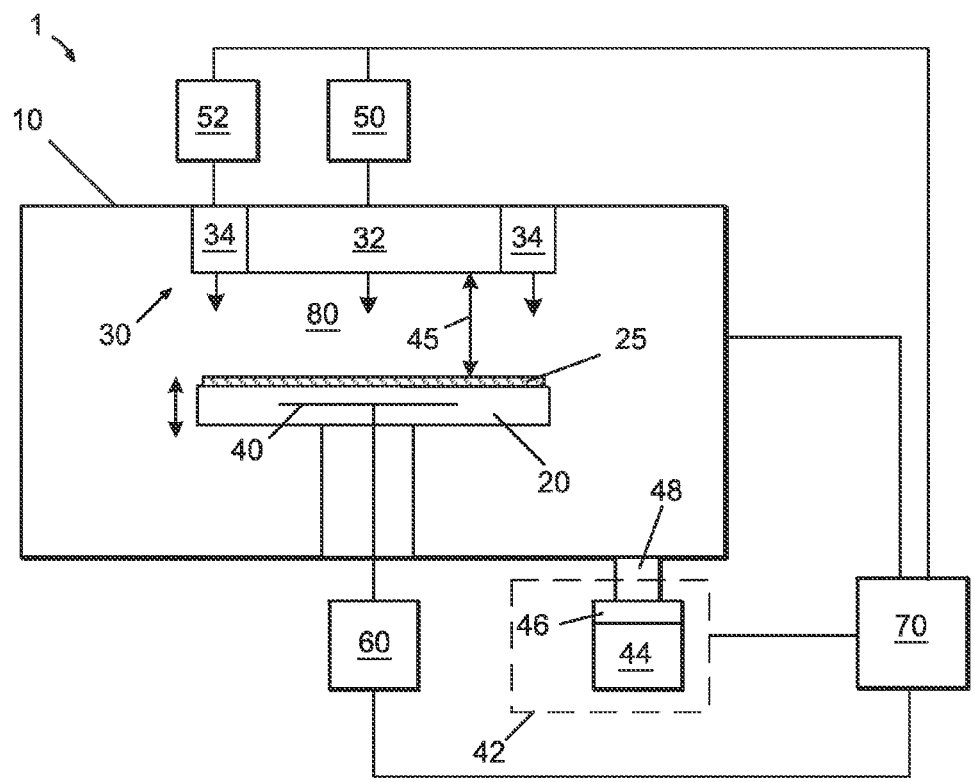
FIG. 7 is a schematic view of a processing system for depositing a Ru metal layer onto a substrate according to embodiments of the invention.

FIG. 7 is a schematic view of a processing system for depositing a Ru metal layer onto a substrate according to embodiments of the invention. The processing system 1 can be used to deposit a variable thickness Ru metal layer or a Ru metal layer with substantially uniform thickness across a substrate. The processing system 1 comprises a process chamber 10 having a substrate holder 20 configured to support a substrate 25, upon which the Ru metal layer is formed. The substrate 25 is positioned on the substrate holder 20 with the edge and center of the substrate 25 generally aligned with the edge and center, respectively, of the substrate holder 20. A showerhead 30 faces the substrate 25 and the substrate holder 20. The vertical position of the substrate holder 20 relative to the showerhead 30 can be adjusted to change the gap 45 between the bottom of the showerhead 30 and the substrate 25 residing on the substrate holder 20. The gap 45 can, for example, be adjusted from about 5 mm to about 50 mm. The showerhead 30 is configured for introducing gases into the processing zone 80 between the substrate 25 and the showerhead 30. The showerhead 30 has an inner gas delivery zone 32 generally aligned with the center of the substrate 25 and the center of the substrate holder 20, and an outer gas delivery zone 34 generally aligned with the edge of the substrate 25 and the edge of the substrate holder 20. The outer gas delivery zone 34 depicted in FIG. 7 can be an annular gas distribution element. It may be understood that general alignment does not require precise alignment, but only a general correlation of position between edge portions and center portions of the respective components.

A first gas source 50 and a second gas source 52 are coupled to the inner gas delivery zone 32 and outer gas delivery zone 34, respectively. The first gas source 50 contains a metal precursor evaporation system (not shown) for supplying as first gas containing a Ru-containing precursor to the processing zone 80 of process chamber 10 via inner gas delivery zone 32. The first gas can further contain an inert gas (e.g., $N_2$, helium or argon), a reducing gas (e.g., hydrogen), or carbon monoxide, or a combination of two or more thereof. The second gas source 52 is configured for supplying a second gas to the processing zone 80 via outer gas delivery zone 34. The second gas can, for example, contain an inert gas (e.g., $N_2$, helium or argon), a reducing gas (e.g., hydrogen), or carbon monoxide, or a combination of two or more thereof. Optionally, the second gas source 52 may further include a metal precursor evaporation system (not shown) for supplying Ru-containing precursor through the outer gas delivery zone 34. When depositing a variable thickness Ru layer, the gas sources 50, 52 and/or delivery zones 32, 34 should then be configured to provide a greater quantity of Ru-containing precursor through the inner gas delivery zone 32 than through the outer gas delivery zone 34, whether by adjusting the relative concentrations or the relative flow rates.

The process chamber 10 is further coupled to a vacuum pumping system 42 through a duct 48, wherein the pumping system 42 contains a vacuum pump 44 and a pressure controller 46. The pumping system 42 is configured to evacuate the process chamber 10 to a pressure suitable for forming the Ru metal layer on the substrate 25. Furthermore, a substrate holder temperature control system 60 is coupled to a substrate heater 40. The substrate heater 40 can, for example, include one or more resistive heating elements. Alternately, the heater 40 can, for example, include a radiant heating system, such as a tungsten-halogen lamp. The substrate holder 20 is configured to elevate the temperature of the substrate 25 by virtue of the substrate holder 20 being coupled to the substrate holder temperature control system 60. For example, the substrate holder temperature control system 60 can be configured to elevate the temperature of the substrate 25 up to approximately 600° C. Additionally, the process chamber 10 can be coupled to a chamber temperature control system (not shown) configured to control the temperature of the chamber walls.

Still referring the FIG. 7, the processing system 1 includes a processing system controller 70 configured to operate and control the operation of the processing system 1. The controller 70 is coupled to the process chamber 10, the substrate holder temperature control system 60, the first gas source 50, the second gas source 52, and the vacuum pumping system 62. The controller 70 includes a microprocessor, a memory, and a digital I/O port capable of generating control voltages sufficient to communicate and activate inputs of the processing system 1 as well as monitor outputs from the processing system 1. A program stored in the memory is utilized to control the aforementioned components of processing system 1 according to a stored process recipe. One example of processing system controller 70 is a DELL PRECISION WORKSTATION 610™, available from Dell Corporation, Dallas, Tex. The controller 70 may also be implemented as a general-purpose computer, digital signal process, etc.

The controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 may be locally located relative to the processing system 1, or it may be remotely located relative to the processing system 1 via the internet or an intranet. Thus, controller 70 can exchange data with the processing system 1 using at least one of a direct connection, an intranet, or the internet. Controller 70 may be coupled to an intranet at a customer site (i.e., a device maker, etc.), or coupled to an intranet at a vendor site (i.e., an equipment manufacturer). Furthermore, another computer (i.e., controller, server, etc.) can access controller 70 to exchange data via at least one of a direct connection, an intranet, or the internet.

According to an embodiment of the invention, the processing system 1 is configured for depositing a variable thickness Ru metal layer on the substrate 25 by exposing the substrate 25 to a first gas containing a Ru-containing precursor flowed through the inner gas delivery zone 32 and exposing the substrate 25 to a second gas flowed through the outer gas delivery zone 34. Once the first and second gases enter the processing zone 80 of the process chamber 10, the Ru-containing precursor is exposed to the heated substrate 25 to deposit a Ru metal layer on the substrate 25. The deposition rate and the resulting thickness profile of the Ru metal layer, i.e., increasing Ru metal layer thickness from the edge of the substrate toward the center of the substrate, are controlled by the composition and relative flows of the first and second gases to the processing zone 80.

For example, increasing the concentration of the Ru-containing precursor in the first gas and/or increasing the flow of the second gas (in particular, when it contains no Ru-containing precursor) relative to the first gas flow generally increases the thickness of the Ru metal layer at the center of the substrate relative to the thickness of the Ru metal layer at the edge of the substrate. In addition, the thickness profile of the deposited Ru metal layer can be controlled by adjusting the gap between the showerhead and the substrate in combination with varying the flow of the second gas relative to the flow of the first gas. In general, when a narrow gap is used, gas concentration at the substrate goes up, thereby increasing the deposition rate at the edge and the center of the substrate. Thus, the flow rate of the second gas can be increased relative to the flow rate of the first gas rate to dilute the Ru-containing precursor near the edge of the substrate and obtain the desired thickness profile of the Ru metal layer.

The Ru-containing precursor can, for example, be a Ru carbonyl precursor or a organometallic Ru precursor suitable for depositing a Ru metal layer on the substrate 25, but embodiments of the invention is not limited to these precursors. According to an embodiment of the invention, the Ru-containing precursor can be a Ru carbonyl precursor such as $Ru_3(CO)_{12}$ or an organometallic Ru precursor such as (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), or (2,4-dimethylpentadienyl) (methylcyclopentadienyl) ruthenium. The above-mentioned precursors are not required for the invention, as other Ru precursors may be used, including the liquid organometallic precursor bis(ethylcyclopentadienyl) ruthenium (Ru(EtCp)$_2$).

According to an embodiment of the invention, the first gas can contain $Ru_3(CO)_{12}$ and an inert gas, and the second gas can contain an inert gas and no precursor.

According to another embodiment of the invention, the first gas can contain $Ru_3(CO)_{12}$ and one or both of carbon monoxide or an inert gas, and the second gas can contain an inert gas, carbon monoxide, or a combination thereof, and no precursor.

According to still another embodiment of the invention, the first gas can contain an organometallic Ru precursor and a reducing gas, or an inert gas, or a combination thereof, and the second gas can contain a reducing gas, an inert gas, or a combination of thereof, and no precursor. The organometallic Ru precursor can, for example, be selected from any of the above-mentioned organometallic Ru precursors.

According to an embodiment of the invention, the process chamber pressure can be maintained at a pressure between about 5 mtorr and about 30 Torr during depositing of the Ru metal layer. According to another embodiment of the invention, the process chamber pressure can be maintained between about 10 mtorr and about 500 mtorr during depositing of the Ru metal, for example about 200 mtorr. According to an embodiment of the invention, the substrate temperature can be between about 100° C. and about 600° C. According to another embodiment of the invention, the substrate temperature can be between about 150° C. and about 400° C. According to yet another embodiment of the invention, the substrate temperature can be between about 200° C. and about 300° C.

According to another embodiment of the invention, the processing system 1 may be configured for depositing Ru metal layer with substantially uniform thickness across a substrate. For example, the Ru metal layer may be deposited on the substrate 25 by exposing the substrate 25 to a first gas containing a Ru-containing precursor flowed through the inner gas delivery zone 32 and exposing the substrate 25 to a second gas flowed through the outer gas delivery zone 34, where the first and second gases have the same or similar gas composition.

Figure 8:
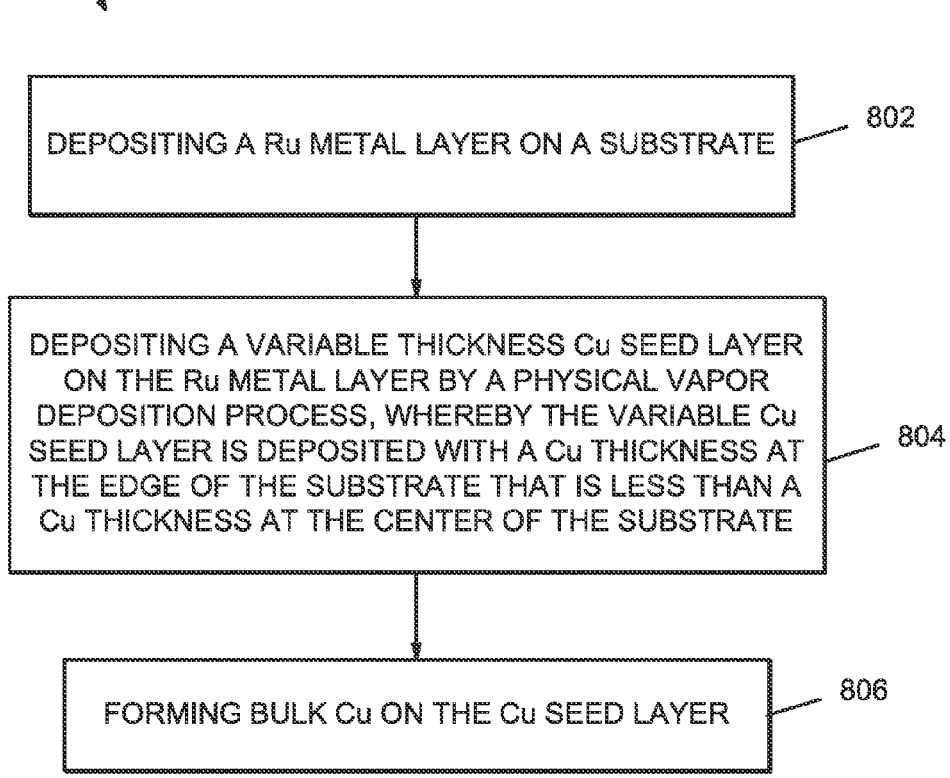
FIG. 8 is a flow diagram showing a method of integrating a variable thickness Cu seed layer into Cu metallization according to an embodiment of the invention.

FIG. 8 is a flow diagram showing a method of integrating a variable thickness Cu seed layer into Cu metallization according to an embodiment of the invention. The process 800 includes in step 802, depositing a Ru metal layer on the substrate. According to one embodiment of the invention, the Ru metal layer is a variable thickness Ru metal layer with a Ru metal thickness at the edge of the substrate that is less than a Ru metal thickness at the center of the substrate. According to another embodiment of the invention, the Ru metal layer has a substantially uniform thickness across the substrate.

In step 804, a variable thickness Cu seed layer is deposited on the Ru metal layer from step 802 by a physical vapor deposition process, where the variable thickness Cu seed layer is deposited with a thickness at the edge of the substrate that is less than a Cu thickness at the center of the substrate.

In step 806, bulk Cu is plated on the variable thickness Cu seed layer. Electroless and electrochemical plating systems and methods of electroplating bulk Cu layer on a Cu seed layer are well known to those skilled in the art, for example, Cu electrochemical plating methods using acidified copper sulfate electrolyte.

As would be appreciated by those skilled in the art, each of the steps or stages in the flowchart of FIG. 8 may encompass one or more separate steps and/or operations. Accordingly, the recitation of only three steps 802, 804, and 806 should not be understood to limit the method of the present invention solely to three steps or stages. Moreover, each representative step or stage 802, 804, 806 should not be understood to be limited to only a single process.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for processing a substrate, the method comprising:
    depositing a Ru metal layer on the substrate;
    depositing a variable thickness Cu seed layer on the Ru metal layer by a physical vapor deposition process comprising sputtering Cu from a Cu metal target, and wherein the depositing comprises adjusting the gap between the Cu metal target and the substrate to control a thickness profile of the variable thickness Cu seed layer whereby the variable thickness Cu seed layer is deposited with a Cu thickness at the edge of the substrate that is less than a Cu thickness at the center of the substrate; and forming bulk Cu on the Cu seed layer in a plating process.

2. The method of claim 1, wherein the Cu thickness at the edge of the substrate is between about 1 nm and about 10 nm and the Cu thickness at the center of the substrate is between about 10 nm and about 80 nm.

3. The method of claim 1, wherein the Cu thickness at the edge of the substrate is between about 1 nm and about 5 nm and the Cu thickness at the center of the substrate is between about 5 nm and about 30 nm.

4. The method of claim 1, wherein the Ru metal layer is deposited from a Ru-carbonyl precursor or an organometallic Ru precursor.

5. The method of claim 1, wherein the depositing a Ru metal layer comprises sputtering Ru from a Ru metal target.

6. The method of claim 1, wherein the substrate comprises a patterned substrate containing one or more vias or trenches, or combinations thereof.

7. The method of claim 6, wherein the Cu thickness at the edge of the substrate is between about 1 nm and about 10 nm and the Cu thickness at the center of the substrate is between about 10 nm and about 80 nm.

8. The method of claim 6, wherein the Ru metal layer has a substantially uniform thickness across the substrate and the Ru metal layer thickness is between 0.5 nm and about 15 nm.

9. The method of claim 6, wherein the Ru metal layer is a variable thickness Ru metal layer with a Ru thickness between about 0.5 nm and about 5 nm at the edge of the substrate and a Ru thickness between about 5 nm and about 15 nm at the center of the substrate, and the variable thickness Ru metal layer is deposited in a processing system that comprises a process chamber containing a showerhead, the showerhead comprising an inner gas delivery zone and an outer gas delivery zone, the method comprising:

providing the substrate in the process chamber with the center of the substrate generally aligned with the inner gas delivery zone and the edge of the substrate generally aligned with the outer gas delivery zone; and depositing the variable thickness Ru metal layer on the substrate by:

exposing the substrate to a first gas flowed through the inner gas delivery zone, the first gas comprising a Ru-containing precursor in a first amount, and exposing the substrate to a second gas flowed through the outer gas delivery zone, the second gas comprising the Ru-containing precursor in a second amount between zero and a value less than the first amount.

10. A method for processing a substrate, the method comprising:

depositing a Ru metal layer on the substrate wherein the Ru metal layer has a substantially uniform thickness across the substrate;

depositing a variable thickness Cu seed layer on the Ru metal layer by a physical vapor deposition process, whereby the variable thickness Cu seed layer is deposited with a Cu thickness at the edge of the substrate that is less than a Cu thickness at the center of the substrate; and forming bulk Cu on the Cu seed layer in a plating process.

11. The method of claim 10, wherein the Ru metal layer has a thickness between about 0.5 nm and about 15 nm.

12. The method of claim 10, wherein the Cu thickness at the edge of the substrate is between about 1 nm and about 10 nm and the Cu thickness at the center of the substrate is between about 10 nm and about 80 nm.

13. The method of claim 10, wherein the Cu thickness at the edge of the substrate is between about 1 nm and about 5 nm and the Cu thickness at the center of the substrate is between about 5 nm and about 30 nm.

14. A method for processing a substrate, the method comprising:

depositing a Ru metal layer on the substrate wherein the Ru metal layer is a variable thickness Ru metal layer with a Ru metal thickness at the edge of the substrate that is less than a Ru metal thickness at the center of the substrate;

depositing a variable thickness Cu seed layer on the Ru metal layer by a physical vapor deposition process, whereby the variable thickness Cu seed layer is deposited with a Cu thickness at the edge of the substrate that is less than a Cu thickness at the center of the substrate; and forming bulk Cu on the Cu seed layer in a plating process.

15. The method of claim 14, wherein the Ru metal thickness at the edge of the substrate is between about 0.5 nm and about 5 nm and the Ru metal thickness at the center of the substrate is between about 5 nm and about 15 nm.

16. The method of claim 14, wherein the Cu thickness at the edge of the substrate is between about 1 nm and about 10 nm and the Cu thickness at the center of the substrate is between about 10 nm and about 80 nm.

17. The method of claim 14, wherein the Cu thickness at the edge of the substrate is between about 1 nm and about 5 nm and the Cu thickness at the center of the substrate is between about 5 nm and about 30 nm.

18. The method of claim 14, wherein the Ru metal layer is deposited in a processing system that comprises a process chamber containing a showerhead, the showerhead comprising an inner gas delivery zone and an outer gas delivery zone, the method comprising:

providing the substrate in the process chamber with the center of the substrate generally aligned with the inner gas delivery zone and the edge of the substrate generally aligned with the outer gas delivery zone; and depositing the variable thickness Ru metal layer on the substrate by:

exposing the substrate to a first gas flowed through the inner gas delivery zone, the first gas comprising a Ru-containing precursor in a first amount, and exposing the substrate to a second gas flowed through the outer gas delivery zone, the second gas comprising the Ru-containing precursor in a second amount between zero and a value less than the first amount.

19. The method of claim 18, further comprising:

adjusting the gap between the showerhead and the substrate to control the thickness profile of the Ru metal layer.

20. The method of claim 18, wherein the Ru-containing precursor comprises a Ru-carbonyl precursor or an organometallic Ru precursor.

21. The method of claim 18, wherein the first gas, the second gas, or both, comprise an inert gas, a reducing gas, carbon monoxide, or a combination thereof.

* * * * *

UNITED STATES PATENT AND TRADEMARK OFFICE
CERTIFICATE OF CORRECTION

PATENT NO. : 7,605,078 B2
APPLICATION NO. : 11/537058
DATED : October 20, 2009
INVENTOR(S) : Kenji Suzuki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 211 days.

Signed and Sealed this

Fifth Day of October, 2010

David J. Kappos
*Director of the United States Patent and Trademark Office*